(12) United States Patent
Yamaguchi et al.

(10) Patent No.: US 7,765,678 B2
(45) Date of Patent: Aug. 3, 2010

(54) METHOD OF BONDING METAL BALL FOR MAGNETIC HEAD ASSEMBLY

(75) Inventors: Ooki Yamaguchi, Niigata-ken (JP); Takao Haino, Niigata-ken (JP)

(73) Assignee: TDK Corporation, Tokyo (JP)

( * ) Notice: Subject to any disclaimer, the term of this patent is extended or adjusted under 35 U.S.C. 154(b) by 913 days.

(21) Appl. No.: 11/480,095

(22) Filed: Jun. 30, 2006

(65) Prior Publication Data
US 2007/0012749 A1 Jan. 18, 2007

(30) Foreign Application Priority Data
Jul. 12, 2005 (JP) ............... 2005-202854

(51) Int. Cl.
*G11B 5/127* (2006.01)
*H04R 31/00* (2006.01)
(52) U.S. Cl. ............. 29/603.16; 29/603.07; 29/603.13; 29/603.15; 29/603.18; 219/121.64; 228/179.1; 228/234.1; 360/129; 360/234.5; 360/313
(58) Field of Classification Search ............. 29/603.07, 29/603.13–603.16, 603.18; 219/121.64; 228/179.1, 234.1; 360/129, 234.5, 313
See application file for complete search history.

(56) References Cited

U.S. PATENT DOCUMENTS 5,828,031 A * 10/1998 Pattanaik ............... 219/121.63
6,336,581 B1 1/2002 Tuchiya et al.
6,543,677 B2 * 4/2003 Pattanaik et al. ............ 228/246
2002/0179696 A1 12/2002 Pattanaik et al.

FOREIGN PATENT DOCUMENTS

| JP | 5-29404 | 2/1993 |
| JP | 2000-12598 | 1/2000 |
| JP | 2002-25025 | 1/2002 |
| JP | 2002-45962 | 2/2002 |

\* cited by examiner

*Primary Examiner*—Paul D Kim
(74) *Attorney, Agent, or Firm*—Brinks Hofer Gilson & Lione

(57) ABSTRACT

A method of bonding a metal ball for a magnetic head assembly is provided. The method comprises: preparing a capillary; disposing the capillary so as to face a bonding surface of the electrode pad of the slider and that of the electrode pad of the flexible printed circuit board; carrying the metal ball to the bonding surfaces by introducing the metal ball and the inactive gas stream into the carrying route of the capillary; positioning and retaining the metal ball on the bonding surfaces by the inactive gas stream passing through the carrying route and issued radially from the cutoff portions; and melting the metal ball by directly applying laser beams via the cutoff portions of the capillary, and bonding the electrode pad of the slider and the electrode pad of the flexible printed circuit board by the melted metal.

9 Claims, 7 Drawing Sheets

METHOD OF BONDING METAL BALL FOR MAGNETIC HEAD ASSEMBLY

This application claims the benefit of Japanese Patent Application No. 2005-202854 filed in Japan on Jul. 12, 2005, hereby incorporated by reference.

BACKGROUND

1. Field

A method of bonding metal balls for magnetic head assemblies that bond electrode pads of sliders and those of flexible printed circuit boards is provided.

2. Description

A magnetic head assembly used in a hard disk drive (HDD) is formed of a slider into which a magnetoresistive element is incorporated and a thin flexible metallic plate, and includes a flexure for elastically supporting the slider and a flexible printed circuit board. The flexible printed circuit board is bonded on the surface of the flexure, and electrically connects the magnetoresistive element of the slider and a circuit system of a device to which this magnetic head assembly is attached. The flexure is fixed to a load beam by, for example, spot welding.

Conventionally, the electrode pads of the magnetoresistive element of the slider and those of the flexible printed circuit board in such a magnetic head assembly have been bonded using gold balls such that the electrode pads are disposed orthogonal to each other. Since the bonding area (the size of the electrode pads and gaps therebetween) has decreased as the sizes of the magnetic head assembly and the slider have been reduced in recent years, solder-ball bonding using solder balls that have smaller diameters than gold balls has been proposed instead of gold-ball bonding.

In solder-ball bonding, a solder ball is fixed on the electrode pad of the slider or on the electrode pad of the flexible printed circuit board using flux. The solder ball is then heated such that the electrode pad of the slider and the electrode pad of the flexible printed circuit board are bonded by the melted solder. According to this form of solder-ball bonding, the joint between the electrode pad of the slider and the electrode pad of the flexible printed circuit board can easily be removed by heating the bonded portion. The flexure can easily be recycled even when the magnetic head assembly is determined to be unacceptable in static and dynamic characteristic tests performed before shipment (See Japanese Unexamined Patent Application Publication Nos. 5-29404, 2000-12598, 2002-25025 (US Publication No. 20020179696), and 2002-45962 (U.S. Pat. No. 6,336,581)).

However, the above-described solder-ball bonding requires flux that fixes the solder ball placed on a bonding surface, and therefore is not applicable to parts that can be contaminated by flux. Various bonding methods without using flux have been proposed recently.

For example, a solder ball is adsorbed by an adsorption nozzle and placed on a bonding surface. While the solder ball is mechanically positioned by the adsorption nozzle, part of the solder ball is melted by a first laser irradiation so as to be temporarily fixed. Then, the adsorption nozzle is removed from the solder ball, and the entire solder ball is melted by a second laser irradiation so as to be completely fixed. The power of laser beams cannot be higher than a predetermined level since the laser beams are applied to the solder ball while the solder ball is mechanically retained by the adsorption nozzle. Therefore, the solder ball cannot be entirely melted by one laser irradiation, and the laser beams are required to be applied to the solder ball in two steps of temporary fixing and final fixing. Thus, the number of steps is increased, and the possibility of heat damage is also increased due to the two laser irradiations.

In another method, the solder ball is placed on the bonding surface by the adsorption nozzle, and then is melted by one laser irradiation while the solder ball is pressed against the bonding surface using nitrogen gas instead of the adsorption nozzle. In this method, the solder ball moves after the solder ball is placed on the bonding surface, and the bonding position is difficult to accurately control.

In another method, the solder ball dropped from a carrying route to the bonding surface is pressed against the bonding surface by nitrogen gas flowing from the same carrying route, and is melted by laser beams emitted through the same carrying route while the solder ball is pressed against the bonding surface. In this method the supplying paths of the solder ball and the laser beams are coaxial, and a high-power laser such as an yttrium aluminum garnet (YAG) laser must be used such that a long focal length of the laser beams can be ensured. Moreover, focusing of the laser beams is difficult since the guiding path of the laser beams is complicated.

SUMMARY

A method of bonding a metal ball for a magnetic head assembly is provided.

The inventors have produced the present invention since the inventors noticed that the metal ball could be fixed by one laser irradiation without using flux when the laser beams were directly applied to the metal ball while the metal ball was positioned using inactive gas streams.

A method of bonding an electrode pad of a slider is provided. The method includes an act of preparing a capillary that includes a carrying route that carries a metal ball by using an inactive gas stream and a plurality of cutoff portions formed by cutting the delivery end portion of the carrying route in the circumferential direction at regular intervals; an act of disposing the capillary so as to face bonding surface of the electrode pad of the slider and that of the electrode pad of the flexible printed circuit board; an act of carrying the metal ball to the bonding surfaces by introducing the metal ball and the inactive gas stream into the carrying route of the capillary, and then positioning and retaining the metal ball on the bonding surfaces by the inactive gas stream passing through the carrying route and issued radially from the cutoff portions; and an act of melting the metal ball by directly applying laser beams via the cutoff portions of the capillary, and bonding the electrode pad of the slider and the electrode pad of the flexible printed circuit board.

It is preferable that the capillary be disposed such that the delivery end portion thereof faces the bonding surface of the electrode pad of the slider and that of the electrode pad of the flexible printed circuit board, and that the position of the metal ball carried to the bonding surfaces be mechanically controlled by adjusting the delivery end portion of the capillary. Predetermined gaps are provided between the end portion of the capillary and the bonding surfaces of both the electrode pads. The metal ball can be positioned more accurately, and is not moved from a position on the bonding surface where the metal ball is placed. The capillary is moved away from the bonding surfaces when the laser irradiation is started.

The capillary may have four cutoff portions disposed in a crisscross manner in the delivery end portion in the circumferential direction at intervals of a 90°. The number of cutoff portions formed in the capillary may be two or more. For example, the capillary has a pair of cutoff portions disposed in the delivery end portion in the circumferential direction at intervals of 180°, and the pair of cutoff portions are aligned along a line parallel to both electrode pads of the slider and the flexible printed circuit board. Thus, the metal ball is retained in three directions by both the electrode pads of the slider and the flexible printed circuit board and the inactive gas stream.

It is preferable that the laser beams be emitted along a direction different from the carrying direction of the metal ball by the inactive gas stream. When the laser beams are emitted along the direction different from the carrying direction of the metal ball by the inactive gas stream, for example, from the outside of the carrying route of the capillary, the laser beams can be accurately applied to the metal ball disposed at a position corresponding to a short focal length. Low-power laser beams can melt the metal ball sufficiently, and high-power laser beams generated by, for example, a YAG laser, or expensive and complicated facilities are not required. As the laser source emitting low-energy laser beams, a semiconductor laser or an infrared laser is practically used.

The method of bonding the metal ball for the magnetic head assembly capable of accurately controlling the bonding position with simplified facilities and steps without using flux is provided.

DRAWINGS

DESCRIPTION

Figure 1:
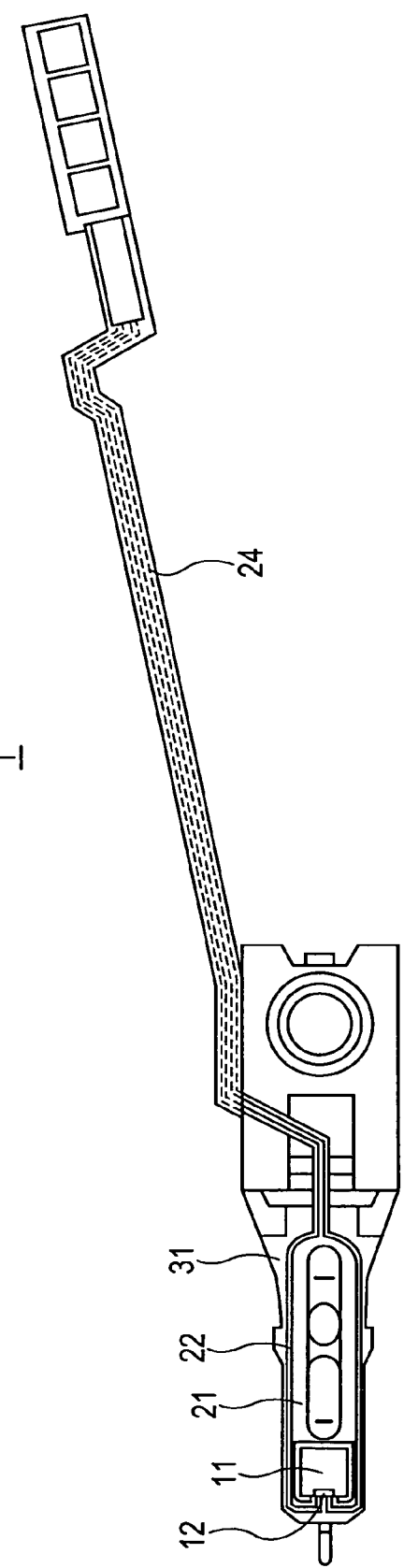
FIG. 1 is a schematic view of a magnetic head assembly (finished form)

FIG. 1 illustrates a magnetic head assembly (finished form) for a hard disk drive. A magnetic head assembly 1 includes a slider 11 that has a magnetoresistive element (magnetic head) 12 incorporated and a flexure 21 bonded to the back of the slider 11 with thermosetting adhesive, UV curable adhesive, conductive adhesive, or the like.

The flexure 21 is a flexible thin metal plate that has a flat spring shape, and is attached to an end portion of a load beam such that the slider 11 is elastically supported with respect to the load beam. Flexible printed circuits (FPCs) 22 that electrically connect the magnetoresistive element of the slider 11 and a circuit system of the hard disk drive to which this magnetic head assembly is attached are fixed on the surface of the flexure 21 with adhesive or the like.

Figure 2:
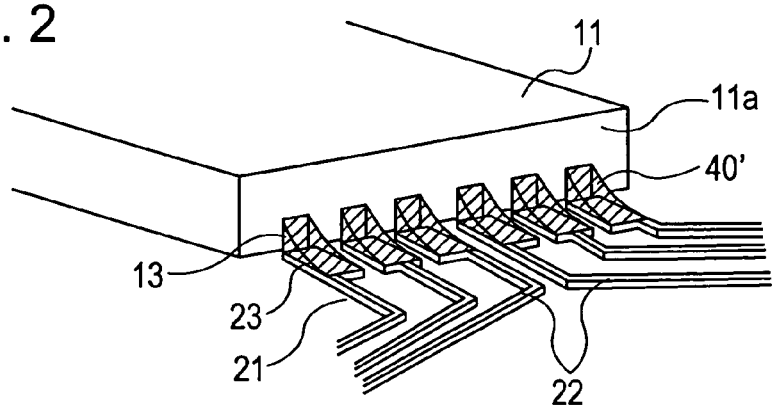
FIG. 2 is an enlarged schematic view of a bonding portion of an electrode pad of a slider and an electrode pad of a flexible printed circuit shown in FIG. 1.

As shown in FIG. 2, the flexible printed circuits 22 extend from a plurality of electrode pads 23 disposed at the leading end of the flexure 21 toward both side edges of the flexure 21, then extend along both side edges, further extend from the trailing end of the flexure 21, and then are joined together via flexible junction printed circuits 24. The flexible junction printed circuits 24 are connected to the circuit system of the hard disk drive to which this magnetic head assembly 1 is installed. A plurality of electrode pads 13 connected to the magnetoresistive element 12 are disposed on a side face 11a of the slider 11. These electrode pads 13 and the electrode pads 23 of the flexible printed circuits 22 are disposed on the flexure 21 such that the electrode pads are orthogonal to each other. The surfaces of both the electrode pads 13 and 23 are plated with gold.

In the magnetic head assembly 1 that has the above-described structure, the electrode pads 13 of the slider 11 and the electrode pads 23 of the flexible printed circuits 22 disposed orthogonal to each other are joined by solder-ball bonding (SBB) using a solder ball that serves as a metal ball.

Figure 3:
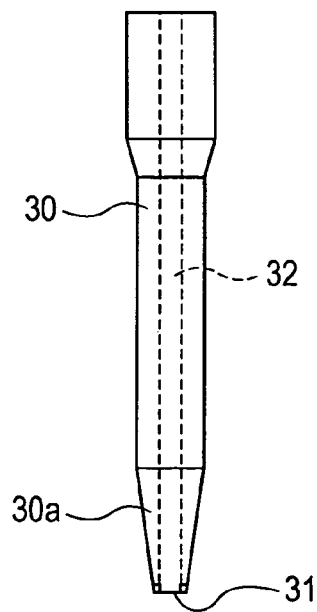
FIG. 3 is a schematic view of an entire capillary used in a solder-ball bonding method according to an embodiment.
Figure 4:
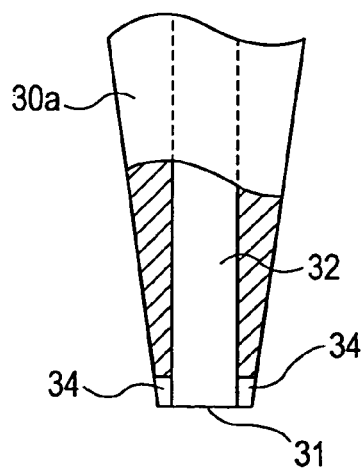
FIG. 4 is a partly sectioned view of a delivery portion of the capillary shown in FIG. 3.
Figure 5:
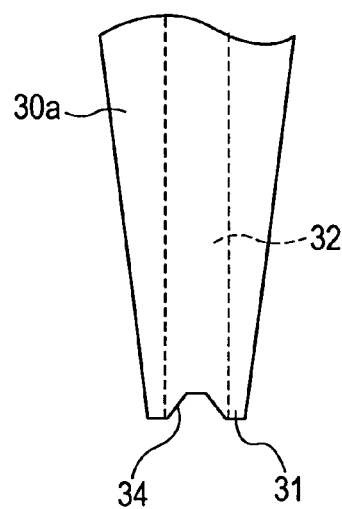
FIG. 5 is a side view of the delivery portion of the capillary shown in FIG. 3.
Figure 6:
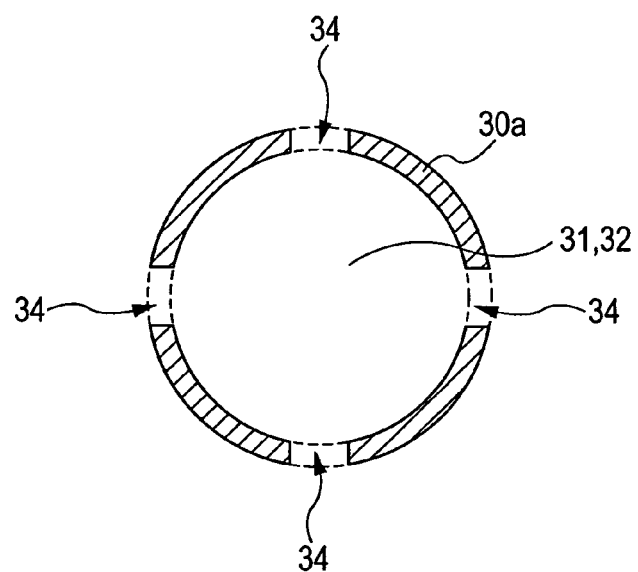
FIG. 6 is a plan view of an end surface of the delivery portion of the capillary shown in FIG. 3.

FIGS. 3 to 6 illustrate a capillary 30 used in the solder-ball bonding. FIG. 3 is a schematic view of the entire capillary 30. FIG. 4 is a cross-sectional view of the capillary 30 adjacent to a delivery port 31 thereof. FIG. 5 is a side view of the capillary 30 adjacent to the delivery port 31. FIG. 6 is a plan view of the delivery port 31 of the capillary 30.

The capillary 30 is of a single-ball bonding type that bonds with a single spherical solder ball 40. This capillary 30 has a slender tube shape with a tapered delivery portion 30a, and includes the circular delivery port 31 formed in the center of the end face of the delivery portion 30a for discharging the solder ball 40 and a carrying route 32 extending along the axial direction of the capillary 30 for carrying the solder ball 40 and nitrogen gas streams $N_2$ to the delivery port 31. Although not shown, the capillary 30 also includes an inlet port for introducing the spherical solder ball 40 and the nitrogen gas streams $N_2$ to the carrying route 32.

The capillary 30 includes a plurality of cutoff portions 34 formed by cutting the end portion (delivery end portion) of the delivery portion 30a off in the circumferential direction at regular intervals, the cutoff portions 34 communicate with the delivery port 31. The cutoff portions 34 function as openings for discharging the nitrogen gas streams $N_2$ passing through the carrying route 32 from the delivery port 31 to the outside of the capillary 30, and also function as openings for allowing passage of laser beams emitted along a direction that is different from the carrying direction of the solder ball 40. The cross section of the cutoff portions 34 is a trapezoid whose base is adjacent to the leading end of the delivery portion 30a is wider than another base remote from the leading end of the delivery portion 30a (see FIG. 5) such that laser beams can be easily and directly applied to the solder ball 40.

As shown in FIG. 6, the four cutoff portions 34 according to this embodiment are formed by cutting the end portion of the delivery portion 30a at intervals of 90°, and discharge the nitrogen gas streams $N_2$ from the delivery port 31 in crisscross directions. A pair of cutoff portions 34 facing each other at an angle of 180° can be simultaneously formed in the end portion of the delivery portion 30a by pressing an abrasive stick against the end face of the delivery portion 30a so as to be parallel to the end face, and by reciprocating the abrasive stick to and from in the radial direction of the delivery port 31. The cross section of the cutoff portions formed at this time is substantially the same as the cross section of the abrasive stick used for grinding.

The diameter of the solder ball 40 is about 130 μm, the diameters of the delivery port 31 and the carrying route 32 are about 150 μm, the depth of the cutoff portions 34 is about 120 μm, and the effective spot diameter of the laser beams is about 100 μm.

Solder-ball bonding will be described with reference to FIGS. 7 to 12.

Figure 7:
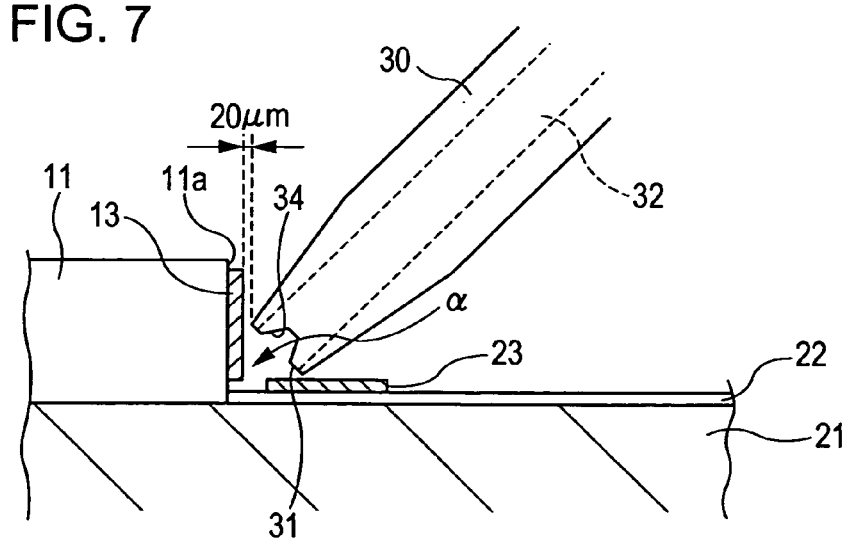
FIG. 7 is a schematic cross-sectional view that illustrates a step of the solder-ball bonding method according to an embodiment.

The capillary 30 shown in FIGS. 3 to 6 is prepared. As shown in FIG. 7, the capillary 30 is inclined by approximately 45° with respect to both an electrode pad 13 of the slider 11 and an electrode pad 23 of a flexible printed circuit 22, and is disposed at a position such that the delivery portion 30a of the capillary 30 is remote from the bonding surface of the electrode pad 13 of the slider 11 and that of the electrode pad 23 of the flexible printed circuit 22 by approximately 20 μm. A space α in which a solder ball 40 is placed and retained is provided among the electrode pad 13 of the slider 11, the electrode pad 23 of the flexible printed circuit 22, and the delivery portion 30a (the delivery port 31).

Figure 8:
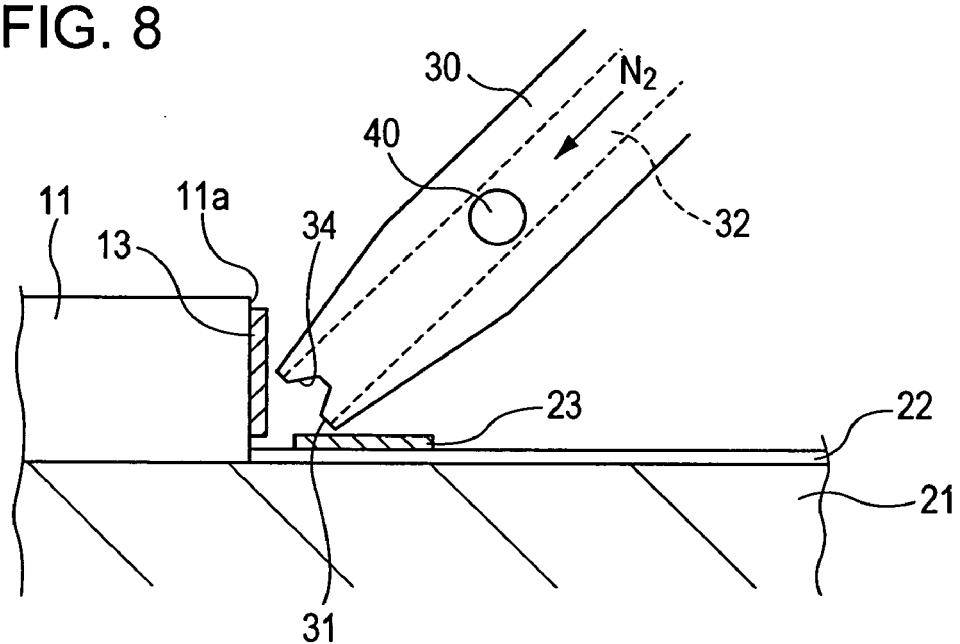
FIG. 8 is a schematic cross-sectional view that illustrates the subsequent step of the step shown in FIG. 7.

As shown in FIG. 8, the spherical solder ball 40 is put into the carrying route 32 of the capillary 30, and at the same time, the nitrogen gas streams $N_2$ are also introduced into the carrying route 32 of the capillary 30. The solder ball 40 put into the carrying route 32 is transported to the delivery port 31 by the nitrogen gas streams $N_2$ flowing inside the carrying route 32 while the solder ball 40 is kept unmelted. The solder ball 40 then free-falls from the delivery port 31 to a position between the electrode pad 13 of the slider 11 and the electrode pad 23 of the flexible printed circuit 22. The solder ball 40 is composed of a soldering material consisting primarily of tin without lead, and is approximately 130 μm in diameter. The nitrogen gas streams $N_2$ prevents the solder ball 40 from being oxidized.

Figure 9:
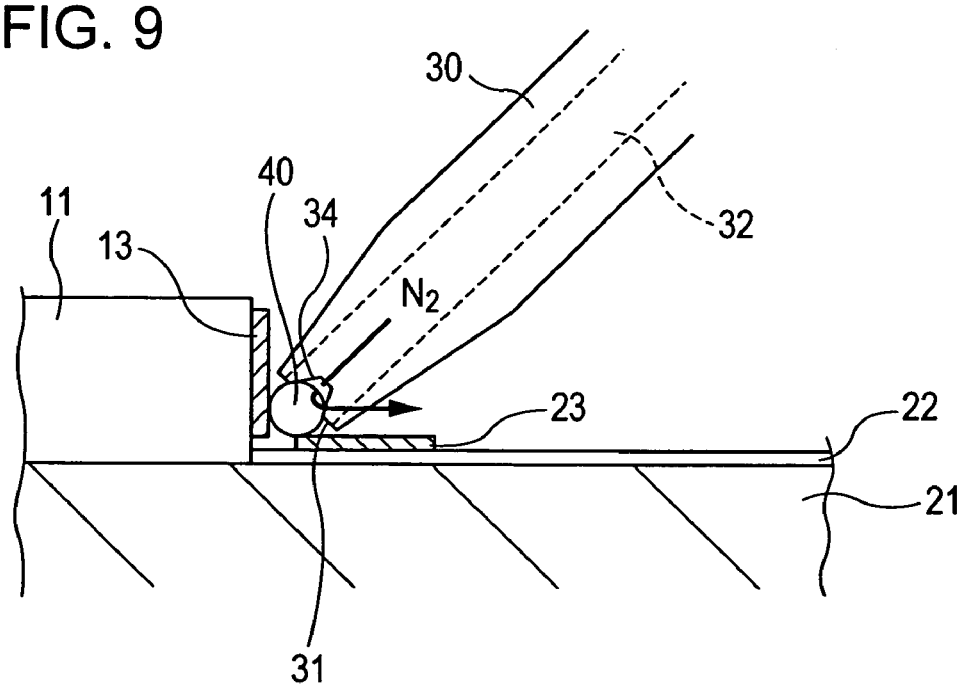
FIG. 9 is a schematic cross-sectional view that illustrates the subsequent step of the step shown in FIG. 8.

As shown in FIG. 9, the free-fallen solder ball 40 is positioned and retained on the bonding surfaces of the electrode pad 13 of the slider 11 and the electrode pad 23 of the flexible printed circuit 22 by the nitrogen gas streams $N_2$ issued radially from the cutoff portions 34 formed in the end portion of the delivery portion 30a. The solder ball 40 ideally free-falls from the delivery port 31 immediately below the central position of the delivery port 31, but may be displaced from the central position of the delivery port 31. Four cutoff portions 34 are formed in the end portion of the delivery portion 30a in the circumferential direction at intervals of 90°.

Figure 10A:
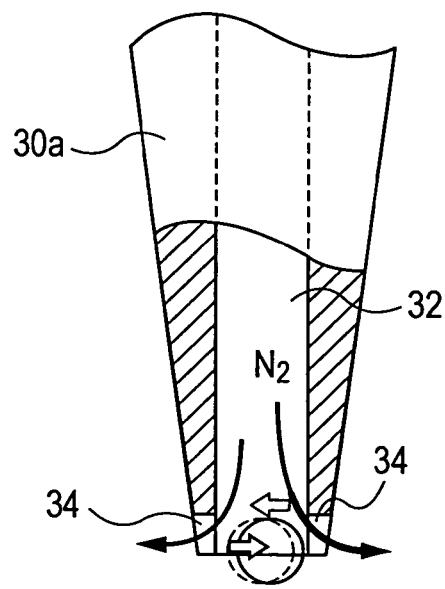
FIGS. 10A and 10B are schematic views that illustrate how the solder ball is positioned by nitrogen gas streams.

When the solder ball 40 is displaced rightward in the drawing from the central position of the delivery port 31 as shown in FIG. 10A, for example, the flow channel of the nitrogen gas streams $N_2$ at the right side of the drawing is narrowed by the displacement of the solder ball 40 and the solder ball 40 is moved leftward in the drawing by the action of repulsive force from the nitrogen gas streams $N_2$ flowing in the flow channel at the right side of the drawing.

Figure 10B:
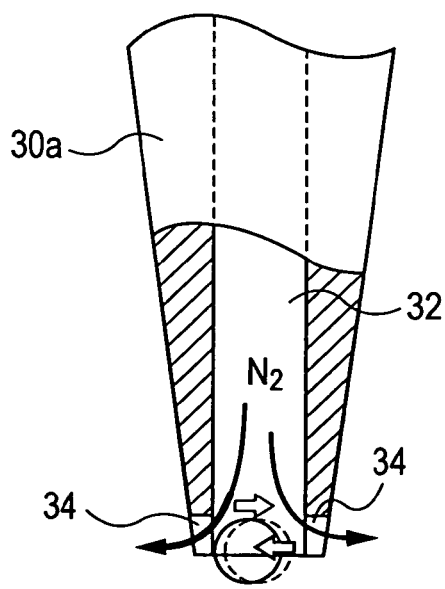

When the solder ball 40 is displaced leftward in the drawing from the central position of the delivery port 31 as shown in FIG. 10B, the flow channel of the nitrogen gas streams $N_2$ at the left side of the drawing is narrowed by the displacement of the solder ball 40 and the solder ball 40 is moved rightward in the drawing by the action of the repulsive force from the nitrogen gas streams $N_2$. By the repetition of these, the solder ball 40 is always retained at the central position of the delivery port 31.

Figure 11:
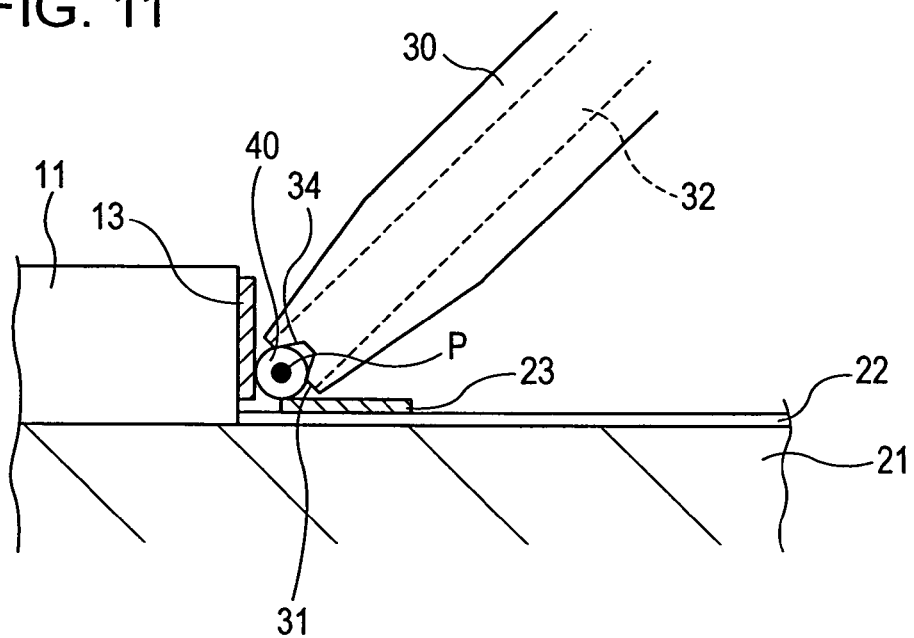
FIG. 11 is a schematic cross-sectional view that illustrates the subsequent step of the step shown in FIG. 9.

While the solder ball 40 is retained by the nitrogen gas streams $N_2$ and the delivery port 31, laser beams are directly applied to the solder ball 40 through the cutoff portions 34 of the capillary 30 as shown in FIG. 11.

An irradiation position P of the laser beams is shown in FIG. 11. The laser beams are emitted from a heat source that is not included in the capillary 30 along a direction that is different from the direction to which the delivery port 31 of the capillary 30 is headed (the direction along which the solder ball 40 is carried by the nitrogen gas streams $N_2$). For example, the laser beams are emitted along a direction that is approximately 45° with respect to both the electrode pad 13 of the slider 11 and the electrode pad 23 of the flexible printed circuit 22 in the same manner as the capillary 30 and being remote from the capillary 30 by a predetermined angle rotated in the clockwise direction or in the counterclockwise direction. In order to completely melt the solder ball 40, the laser power at this time is set such that the effective spot diameter of the laser beams is slightly smaller than the diameter of the solder ball 40.

The diameter of the solder ball 40 is approximately 130 μm, and thus it is preferable that the effective spot diameter of the laser beams be approximately 100 μm. As the laser heat source, semiconductor lasers or infrared lasers that emit low-energy beams can be used. Since the cross section of the cutoff portions 34 is a trapezoid whose base is adjacent to the leading end of the delivery portion 30a and is wider than another base remote from the leading end of the delivery portion 30a such that the laser beams can easily be passed through the cutoff portions 34, the laser beams can be efficiently applied to the solder ball 40 with a small loss.

Figure 12:
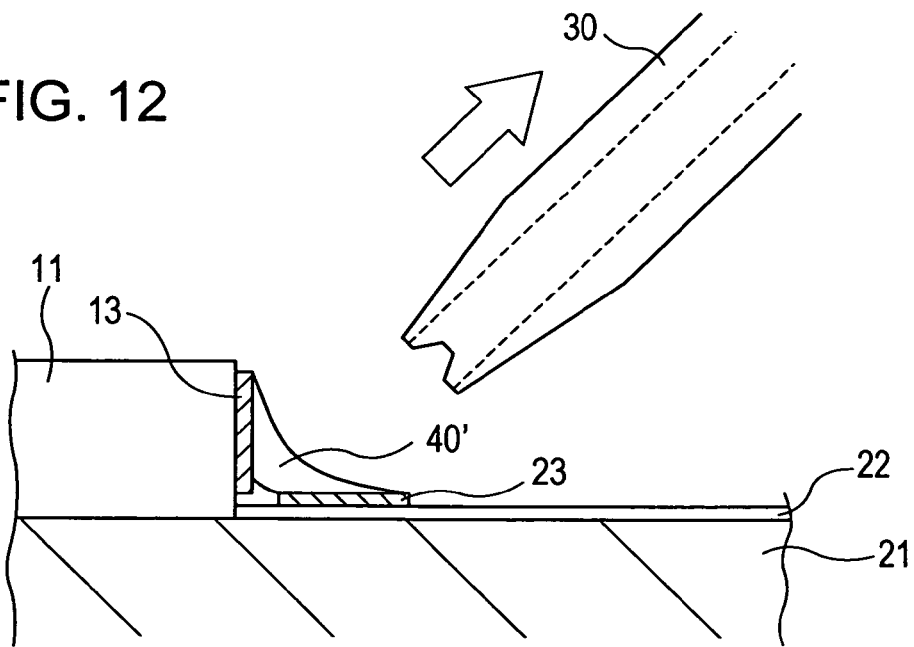
FIG. 12 is a schematic cross-sectional view that illustrates the subsequent step of the step shown in FIG. 11.

When the laser irradiation is started, the capillary 30 is moved away from the bonding surfaces of the electrode pad 13 of the slider 11 and the electrode pad 23 of the flexible printed circuit 22 as shown in FIG. 12, and the solder ball 40 is completely melted by applying the laser beams during a predetermined period of time. After the solder ball 40 is completely melted, both the electrode pads 13 and 23 of the slider 11 and the flexible printed circuit 22, are bonded using a re-solidified solder 40'.

In this embodiment, the solder ball 40 that has free-fallen from the delivery port 31 of the capillary 30 is positioned by the nitrogen gas streams $N_2$ issued evenly outward (radially) via the cutoff portions 34 formed in the delivery end portion of the capillary 30, and directly irradiated with the laser beams through the cutoff portions 34. Both the electrode pads 13 and 23 of the slider 11 and the flexible printed circuit 22, are bonded. Since the solder ball 40 is positioned by the nitrogen gas streams $N_2$ isotropically issued from the cutoff portions 34 in this manner, the solder ball 40 that is likely to be shifted from the central position of the delivery port 31 is pushed back by the nitrogen gas streams $N_2$. The solder ball 40 can be placed on the bonding surface with a high positioning accuracy using only the nitrogen gas streams $N_2$ issued from the cutoff portions 34 without using flux.

When a solder ball is positioned by nitrogen gas streams issued from above such that the entire solder ball is covered with the nitrogen gas streams, the solder ball once decentered cannot be returned to the original position, resulting in a variation in the bonding position.

The solder ball 40 is completely melted by one laser irradiation, and therefore the laser beams are not required to be applied to the solder ball 40 in two steps of temporary fixing and final fixing. The number of steps can be reduced such that the production is facilitated, and heat damage caused by the laser irradiation can also be reduced.

The laser beams are emitted to the solder ball 40 along a direction different from the carrying direction of the solder ball 40 and the nitrogen gas streams $N_2$, for example, from the outside of the carrying route 32 of the capillary 30. The focal length of the laser beams can be shortened such that the focusing of the laser beams is facilitated. Since the solder ball 40 can be sufficiently melted by laser beams with low energy, laser beams with high energy generated by a YAG laser and the like, or expensive and complicated facilities are not required.

Figure 13A:
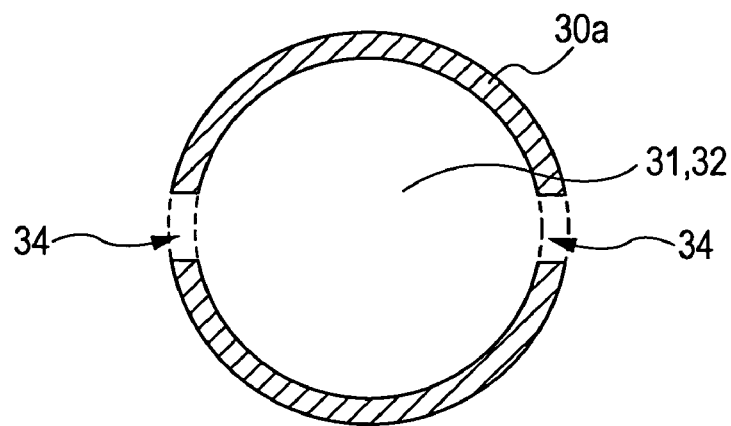
FIGS. 13A and 13B are plan views of a delivery port of the capillary having two cutoff portions and three cutoff portions.
Figure 13B:
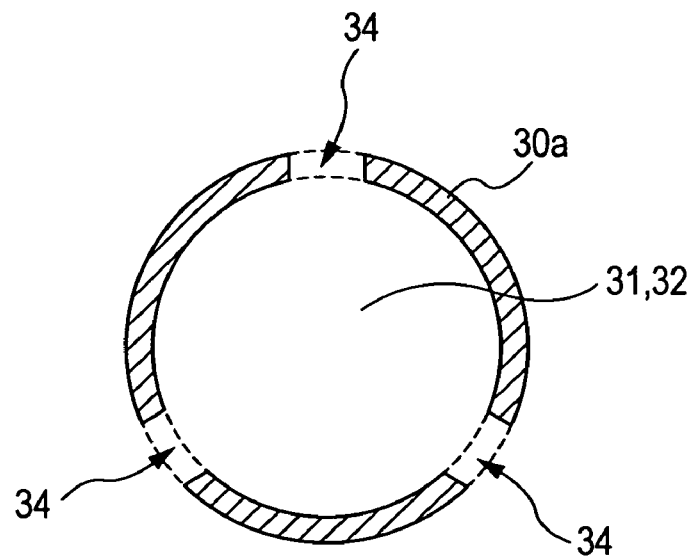

Four cutoff portions 34 are disposed in a crisscross manner in the delivery end portion of the capillary 30. Two cutoff portions 34 may be formed as shown in FIG. 13A. Three cutoff portions 34 may be formed as shown in FIG. 13B. Five or more cutoff portions 34 may be formed.

As shown in FIG. 13A, when a pair of cutoff portions 34 face each other at an angle of approximately 180° in the circumferential direction are formed in the delivery port 31, the capillary 30 is disposed such that the cutoff portions 34 are aligned along a line parallel to both the electrode pads 13 and 23 of the slider 11 and the flexible printed circuit 22, respectively. Since the solder ball 40 that has free-fallen from the delivery port 31 is in contact with both the electrode pads 13 and 23 of the slider 11 and the flexible printed circuit 22, the solder ball 40 can be positioned in the directions parallel to both the electrode pads 13 and 23 by controlling the nitrogen gas streams $N_2$ issued from the pair of cutoff portions 34.

The nitrogen gas streams $N_2$ are used for carrying and positioning the solder ball 40. Inactive gas streams of helium, neon, argon, or the like can be used instead of the nitrogen gas streams $N_2$.

The solder ball 40 not including lead is used as a metal ball. A solder mainly composed of, for example, lead and tin may be used, and a low-melting temperature metal may also be used instead of the solder.

What is claimed is:

1. A method of bonding a metal ball for a magnetic head assembly, comprising:
    preparing a capillary that includes a carrying route that carries a metal ball by using an inactive gas stream and a plurality of cutoff portions formed by cutting a delivery end portion of the carrying route to form grooves in a circumferential direction at regular intervals;
    disposing the capillary so as to face a bonding surface of an electrode pad of the slider and a bonding surface of an electrode pad of a flexible printed circuit board;
    carrying the metal ball to the bonding surfaces by introducing the metal ball and the inactive gas stream into the carrying route of the capillary;
    positioning and retaining the metal ball on the bonding surfaces by the inactive gas stream passing through the carrying route and issued radially from the cutoff portions; and
    melting the metal ball by directly applying laser beams to the metal ball positioned and retained in the delivery end portion of the carrying route via the cutoff portions from outside of the capillary using a heat source that is not included in the capillary, and bonding the electrode pad of the slider and the electrode pad of the flexible printed circuit board by the melted metal.

2. The method of bonding the metal ball for the magnetic head assembly according to claim 1,
    wherein the capillary is disposed such that the delivery end portion thereof faces the bonding surface of the electrode pad of the slider and the bonding surface of the electrode pad of the flexible printed circuit board, and the position of the metal ball carried to the bonding surfaces is mechanically controlled by adjusting the delivery end portion of the capillary.

3. The method of bonding the metal ball for the magnetic head assembly according to claim 2,
    wherein the capillary is moved away from the bonding surfaces when the laser irradiation is started.

4. The method of bonding the metal ball for the magnetic head assembly according to claim 1,
    wherein the capillary has four cutoff portions disposed in a crisscross manner in the delivery end portion in the circumferential direction at intervals of approximately 90.degree.

5. The method of bonding the metal ball for the magnetic head assembly according to claim 1,
    wherein the capillary has a pair of cutoff portions disposed in the delivery end portion in the circumferential direction at intervals of approximately 180.degree., and the pair of cutoff portions are aligned along a line parallel to both electrode pads of the slider and the flexible printed circuit board.

6. The method of bonding the metal ball for the magnetic head assembly according to claim 1,
    wherein the laser beams are emitted along a direction different from the carrying direction of the metal ball by the inactive gas stream.

7. The method of bonding the metal ball for the magnetic head assembly according to claim 6,
    wherein the laser beams are emitted from a semiconductor laser or an infrared laser.

8. The method of bonding the metal ball for the magnetic head assembly according to claim 1,
    wherein the method being applied bonds the electrode pad of the slider that is incorporated into a magnetoresistive element and the electrode pad of the flexible printed circuit board that connects the magnetoresistive element and an external circuit; and
    wherein both pads are disposed orthogonal to each other.

9. The method of bonding the metal ball for the magnetic head assembly according to claim 1,
    wherein the cross section of the cutoff portions is a trapezoid whose base that is adjacent to the leading end of the delivery end portion is wider than another base remote from the leading end of the delivery end portion.

* * * * *